(12) United States Patent
Chen

(10) Patent No.: US 9,905,806 B2
(45) Date of Patent: Feb. 27, 2018

(54) ENCAPSULATION STRUCTURES OF OLED, ENCAPSULATION METHODS, AND OLEDS

(71) Applicant: Shenzhen China Star Optoelectronics Technology Co., Ltd., Shenzhen, Guangdong (CN)

(72) Inventor: Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 202 days.

(21) Appl. No.: 14/914,656

(22) PCT Filed: Jan. 21, 2016

(86) PCT No.: PCT/CN2016/071543
§ 371 (c)(1),
(2) Date: Feb. 26, 2016

(87) PCT Pub. No.: WO2017/096696
PCT Pub. Date: Jun. 15, 2017

(65) Prior Publication Data
US 2018/0034004 A1  Feb. 1, 2018

(30) Foreign Application Priority Data
Dec. 9, 2015 (CN) .......................... 2015 1 0900239

(51) Int. Cl.
*H01L 51/52* (2006.01)
*H01L 23/31* (2006.01)
*H01L 23/29* (2006.01)
*H01L 51/56* (2006.01)

(52) U.S. Cl.
CPC ........ *H01L 51/5268* (2013.01); *H01L 23/291* (2013.01); *H01L 23/293* (2013.01); *H01L 23/3135* (2013.01); *H01L 51/56* (2013.01); *H01L 2251/5369* (2013.01)

(58) Field of Classification Search
CPC . H01L 23/291; H01L 23/293; H01L 23/3135; H01L 51/5268; H01L 51/56
See application file for complete search history.

(56) References Cited

U.S. PATENT DOCUMENTS

| 7,952,105 | B2 | 5/2011 | Cok | |
| 2007/0114925 | A1* | 5/2007 | Cok | ................... H01L 51/5268 313/512 |
| 2007/0267966 | A1* | 11/2007 | Numajiri | ................... B32B 7/02 313/502 |

(Continued)

*Primary Examiner* — Allan R Wilson
(74) *Attorney, Agent, or Firm* — Andrew C. Cheng

(57) ABSTRACT

A OLED encapsulation structure includes: a first encapsulation layer; a second encapsulation arranged on one side of the first encapsulation layer; and scattering particles formed between the first encapsulation layer and the second encapsulation layer, and the scattering particles are configured to scatter incident lights. In addition, an encapsulation method of OLEDs and the OLEDs having the encapsulation structure are disclosed. The scattering particles are formed within the cathode encapsulation layer. The scattering particles may generate the scattering effect for the ambient lights or the stray lights to reduce the reflection of the light beams by the cathode. Thus, the brightness and the clearness of the OLED may be enhanced.

1 Claim, 3 Drawing Sheets

(56) References Cited

U.S. PATENT DOCUMENTS

| | | | |
|---|---|---|---|
| 2008/0169758 A1* | 7/2008 | Cok | H01L 51/5262 |
| | | | 313/506 |
| 2008/0272367 A1 | 11/2008 | Cok | |
| 2012/0155093 A1 | 6/2012 | Yamada | |
| 2013/0105770 A1* | 5/2013 | Pschenitzka | H01L 31/0232 |
| | | | 257/40 |
| 2017/0062765 A1* | 3/2017 | Yang | H01L 51/5268 |

\* cited by examiner

ENCAPSULATION STRUCTURES OF OLED, ENCAPSULATION METHODS, AND OLEDS

BACKGROUND OF THE INVENTION

1. Field of the Invention

The present disclosure relates to display technology, and more particularly to an encapsulation structure of organic light-emitting diodes (OLEDs), an encapsulation method, and the OLEDs having the encapsulation structure.

2. Discussion of the Related Art

OLEDs may include an anode, a cathode and a light emitting layer. The cathode may be made by metallic materials, such as Al, and the anode may be made by materials such as ITO. The electron and the hole are respectively injected via the cathode and the anode such that excitons are formed on the organic light emitting layer such that the light emitting layer is activated to emit the lights.

Currently, most of the OLEDs adopt anode light emitting structure and the cathode operates as the reflective layer, which causes the ambient lights or the internal scattering lights are reflected after radiating on the cathode. Especially, most of the cathode are metal and thus the reflective rate is high, and thus the contrastness and the clearness of the OLED is reduced.

SUMMARY

In order to overcome the above problems, it is necessary to provide an encapsulation structure of OLEDs, an encapsulation method, and the OLEDs having the encapsulation structure for enhancing the contrastness and the clearness.

In one aspect, an encapsulation structure of OLEDs includes: a first encapsulation layer; a second encapsulation arranged on one side of the first encapsulation layer; and scattering particles formed between the first encapsulation layer and the second encapsulation layer, and the scattering particles are configured to scatter incident lights.

Wherein the first encapsulation layer is a polymer film.

Wherein the first encapsulation layer is made by one of Fluorinated Polymers, Parylene, Cyclotene, and Polyacrylates.

Wherein the second encapsulation layer is made by ceramics.

Wherein the diffusion particles are spherical, hemispheric, ellipsoidal, or arc-shaped.

In another aspect, an OLED includes: a cathode and a OLED encapsulation structure, the OLEDs are formed on a surface of the cathode, the OLED encapsulation structure includes: a first encapsulation layer; a second encapsulation arranged on one side of the first encapsulation layer; and scattering particles formed between the first encapsulation layer and the second encapsulation layer, and the scattering particles are configured to scatter incident lights.

Wherein the first encapsulation layer is a polymer film.

Wherein the first encapsulation layer is made by one of Fluorinated Polymers, Parylene, Cyclotene, and Polyacrylates.

Wherein the second encapsulation layer is made by ceramics.

Wherein the diffusion particles are spherical, hemispheric, ellipsoidal, or arc-shaped.

Wherein the cathode is one of the Al, Ag, Li, Mg, In, or an alloy of several metals.

In another aspect, an encapsulation method of OLEDs includes: forming a first encapsulation layer on a surface of a cathode of the OLED; forming scattering particles on a surface of the first encapsulation layer; and forming a second encapsulation layer on the first encapsulation layer to cover the scattering particles.

Wherein the scattering particles are made by any one of the following methods: adopting a fast film-formation method to damage film-formation quality of the first encapsulation layer such that the surface of the first encapsulation layer includes an island-shaped structure to form the scattering particles; heating up a plurality of heating points of the first encapsulation layer, a location of each of the heating points corresponds to one scattering particle such that materials in a rim of the heating point shrink down to the heating point to form the scattering particles; adopting a manufacturing method of sphere-inorganic-nano particles to generate the scattering particles, mixing the scattering particles into solvent, coating the solvent on the surface of the first encapsulation layer, and applying a baking process to vaporize the solvent to form the scattering particles on the surface of the first encapsulation layer; and adopting a high precision masking sheet to etch the surface of the first encapsulation layer to form the scattering particles.

In view of the above, the scattering particles are formed within the cathode encapsulation layer. The scattering particles may generate the scattering effect for the ambient lights or the stray lights to reduce the reflection of the light beams by the cathode. Thus, the brightness and the clearness of the OLED may be enhanced.

DETAILED DESCRIPTION OF THE EMBODIMENTS

Embodiments of the invention will now be described more fully hereinafter with reference to the accompanying drawings, in which embodiments of the invention are shown.

Figure 1:
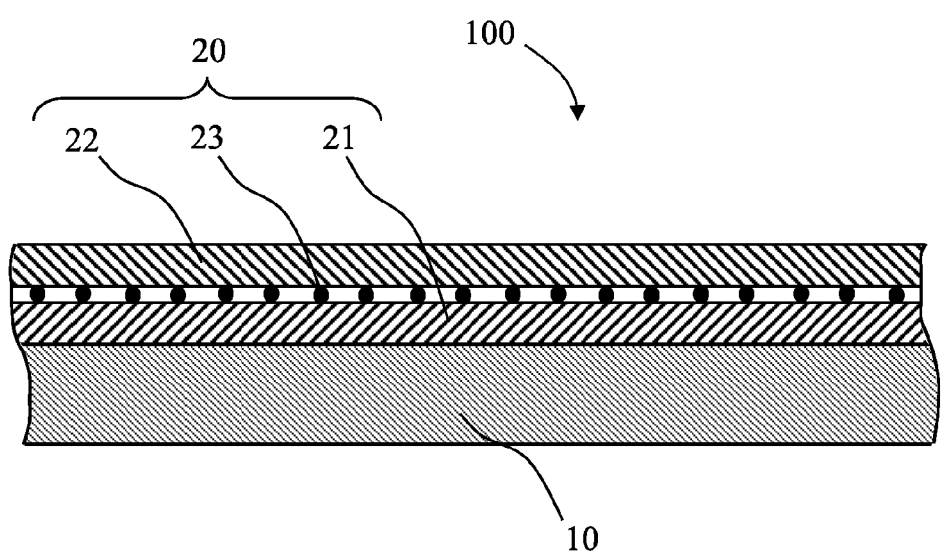
FIG. 1 is a schematic view of the OLED in accordance with one embodiment.

FIG. 1 is a schematic view of the OLED in accordance with one embodiment. The OLED 100 includes a cathode 10 and an encapsulation structure 20 formed on the surface of the cathode 10. It can be understood that FIG. 1 only shows an example, the OLED 100 may include, but not limited to, an anode and a light emitting layer between the cathode 10 and the anode. The anode may be made by ITO materials, and the light emitting layer is the organic material layer, such as polymer. The light emitting layer emits the lights after a predetermined voltage is applied between the anode and the cathode 10. The lights of the RGB colors generated by the light emitting layer may be controlled in accordance with the materials of the light emitting layer. In the embodiment, the OLED 100 is a top emission OLED.

The cathode 10 is a metallic material layer. Specifically, the cathode 10 may be one of the Al, Ag, Li, Mg, In, or an alloy of several metals.

The encapsulation structure 20 seals the OLED 100 to prevent the OLED 100 from being affected by impurity such as water or air.

The encapsulation structure 20 is of a translucent structure. The encapsulation structure 20 includes a first encapsulation layer 21, a second encapsulation layer 22, and a plurality of diffusion particles 23 between the first encapsulation layer 21 and the second encapsulation layer 22.

The first encapsulation layer 21 is formed on the surface of the cathode 10. In the embodiment, the first encapsulation layer 21 is a polymer film. Specifically, the first encapsulation layer 21 may be made by one of Fluorinated Polymers, Parylene, Cyclotene, and Polyacrylates.

The second encapsulation layer 22 is formed on one side of the first encapsulation layer 21 facing away the cathode 10. The second encapsulation layer 22 may be made by the same or different material with the first encapsulation layer 21. In the embodiment, the second encapsulation layer 22 may be made by ceramics.

Figure 2:
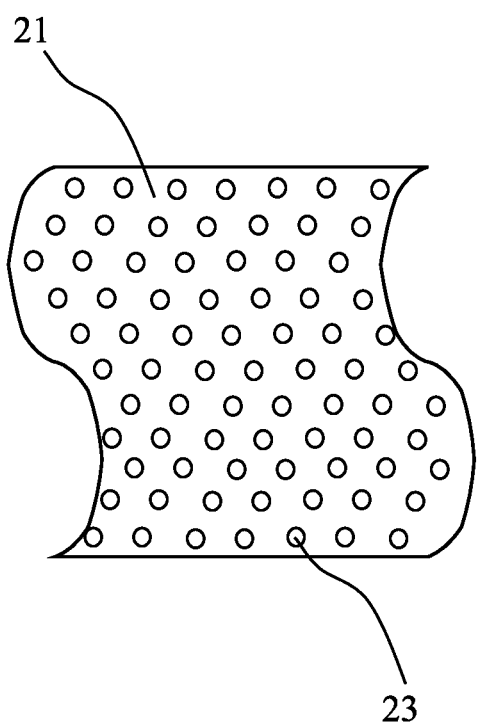
FIG. 2 is a top view of the first encapsulation layer of the OLED of FIG. 1.

The diffusion particles 23 are configured to change the direction of incident lights so as to scatter the incident lights. The diffusion particles 23 may be formed on the first encapsulation layer 21 or on the second encapsulation layer 22. In the embodiment, the diffusion particles 23 are formed on the first encapsulation layer 21, and the diffusion particles 23 are made by the same materials with the first encapsulation layer 21. Also referring to FIG. 2, the diffusion particles 23 are of spherical-shaped, and the diffusion particles 23 are uniformly distributed on the surface of the first encapsulation layer 21. It can be understood that, in other embodiments, the diffusion particles 23 may be spherical, hemispheric, ellipsoidal, or arc-shaped. The distribution of the diffusion particles 23 may be regular or irregular in accordance with demands.

Due to the diffusion particles 23, the ambient lights or the stray lights may be scattered to reduce the reflection of the light beams by the cathode. Thus, the contrastness and the clearness of the OLED 100 may be enhanced.

Figure 3:
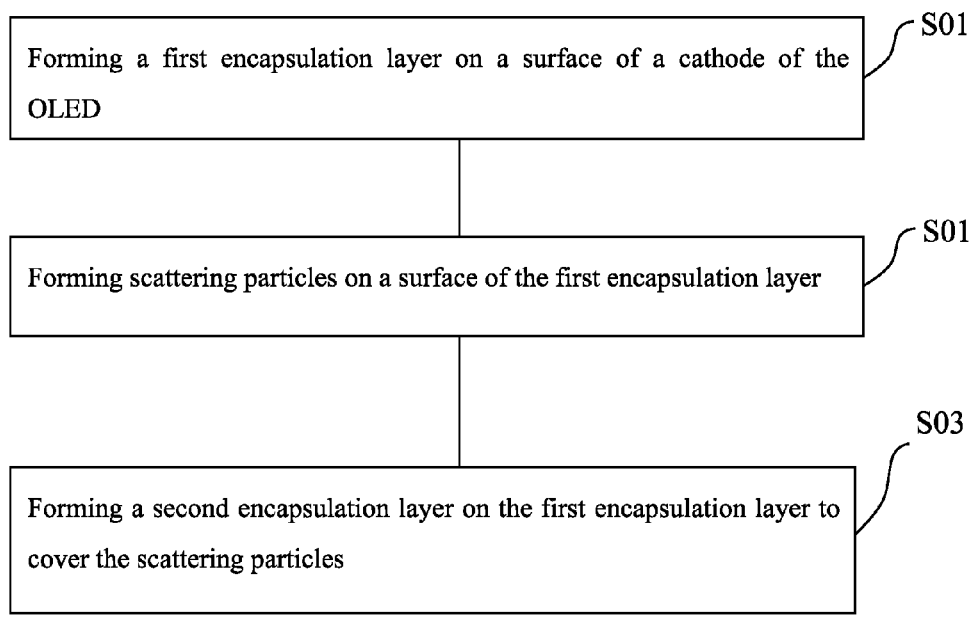
FIG. 3 is a flowchart of the encapsulation method of OLEDs in accordance with one embodiment.

FIG. 3 is a flowchart of the encapsulation method of OLEDs in accordance with one embodiment. The method includes the following steps.

In step S01, the first encapsulation layer is formed on the surface of the cathode of the OLED.

The first encapsulation layer may be made by Physical Vapor Deposition (PVD), Chemical Vapor Deposition (CVD), Atomic Layer Deposition (ALD) or other appropriate methods.

Specifically, in the embodiment, the OLED is arranged within a vacuum chamber such that the mother liquid of the materials of the first encapsulation layer may be quickly vapored into the air. The air is directed into the vacuum chamber such that the air is condensed, in a liquid form, on the surface of the cathode of the OLED. The liquid condensates on the surface of the cathode are solidified to form a solid coating, that is, the first encapsulation layer. The solidification may be conducted by ultraviolet rays. The mother liquid may be one of Fluorinated Polymers, Parylene, Cyclotene, Polyacrylates.

In step S02, the scattering particles are formed on the surface of the first encapsulation layer.

Specifically, the scattering particles are formed by one of the following methods.

A fast film-forming method is adopted to damage the film-formation quality of the first encapsulation layer. As such, the surface of the first encapsulation layer may include an island-shaped structure to form the scattering particles;

The first encapsulation layer is heated via multiple points. The location of each of the heating points corresponds to one scattering particle such that the materials in a rim of the heating point shrink down to the heating point to form the scattering particles.

A manufacturing method of sphere-inorganic-nano particles is adopted to generate the scattering particles, and the scattering particles are mixed into solvent. The solvent is coated on the surface of the first encapsulation layer. in the end, the solvent is vaporized by baking, and the scattering particles are formed on the surface of the first encapsulation layer.

A high precision masking sheet is adopted to etch the surface of the first encapsulation layer to form the scattering particles.

In step S3, a second encapsulation layer is formed on the surface of the first encapsulation layer to cover the scattering particles.

The second encapsulation may be made by the same materials and the same method with the first encapsulation layer, or may be made by other appropriate materials and other methods.

In the embodiment, the second encapsulation layer is made by ceramics, and the ceramics are deposited on the surface of the first encapsulation layer.

The OLED encapsulation method forms the scattering particles within the cathode encapsulation layer. The scattering particles may generate the scattering effect for the ambient lights or the stray lights to reduce the reflection of the light beams by the cathode. Thus, the brightness and the clearness of the OLED may be enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An encapsulation method of OLEDs, comprising:
   forming a first encapsulation layer on a surface of a cathode of the OLED;
   forming scattering particles on a surface of the first encapsulation layer;
   forming a second encapsulation layer on the first encapsulation layer to cover the scattering particles; and
   wherein the scattering particles are made by any one of the following methods:
   adopting a fast film-formation method to damage film-formation quality of the first encapsulation layer such that the surface of the first encapsulation layer comprises an island-shaped structure to form the scattering particles;
   heating up a plurality of heating points of the first encapsulation layer, a location of each of the heating points corresponds to one scattering particle such that materials in a rim of the heating point shrink down to the heating point to form the scattering particles;
   adopting a manufacturing method of sphere-inorganic-nano particles to generate the scattering particles, mixing the scattering particles into solvent, coating the solvent on the surface of the first encapsulation layer, and applying a baking process to vaporize the solvent to form the scattering particles on the surface of the first encapsulation layer; and adopting a high precision masking sheet to etch the surface of the first encapsulation layer to form the scattering particles.

\* \* \* \* \*